United States Patent
Albagli et al.

(10) Patent No.: US 8,053,777 B2
(45) Date of Patent: Nov. 8, 2011

(54) THIN FILM TRANSISTORS FOR IMAGING SYSTEM AND METHOD OF MAKING THE SAME

(75) Inventors: Douglas Albagli, Clifton Park, NY (US); William Andrew Hennessy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 1208 days.

(21) Appl. No.: 11/096,177

(22) Filed: Mar. 31, 2005

(65) Prior Publication Data

US 2006/0219929 A1    Oct. 5, 2006

(51) Int. Cl.
*H01L 29/10* (2006.01)
*H01L 29/76* (2006.01)
*H01L 31/036* (2006.01)
*H01L 31/112* (2006.01)
*H01L 29/04* (2006.01)
*H01L 31/0376* (2006.01)
*H01L 31/20* (2006.01)
*H01L 29/15* (2006.01)
*H01L 27/10* (2006.01)
*H01L 29/73* (2006.01)
*H01L 29/74* (2006.01)
*H01L 23/053* (2006.01)
*H01L 23/12* (2006.01)
*H01L 23/48* (2006.01)
*H01L 23/52* (2006.01)
*H01L 29/40* (2006.01)

(52) U.S. Cl. ............ 257/66; 257/57; 257/59; 257/72; 257/207; 257/208; 257/211; 257/700; 257/758; 257/759; 257/760; 257/E29.151

(58) Field of Classification Search .......... 257/59, 257/72, 207–208, 211, 700, 758–760, 57, 257/66, E29.151
See application file for complete search history.

(56) References Cited

U.S. PATENT DOCUMENTS

| | | | |
|---|---|---|---|
| 3,760,384 A | 9/1973 | Krolikowski et al. | 340/173 R |
| 4,679,302 A | 7/1987 | Theriault et al. | 29/ 571 |
| 6,362,028 B1 | 3/2002 | Chen et al. | 438/149 |
| 6,396,046 B1 | 5/2002 | Possin et al. | |
| 6,437,370 B1 * | 8/2002 | Matsuno | 257/72 |
| 6,528,819 B2 * | 3/2003 | Choo et al. | 257/59 |
| 6,531,346 B1 * | 3/2003 | Kim | 438/149 |
| 6,559,506 B1 * | 5/2003 | Lee et al. | 257/350 |
| 6,570,161 B2 * | 5/2003 | You et al. | 250/370.09 |
| 6,607,935 B2 * | 8/2003 | Kwon | 438/56 |

(Continued)

FOREIGN PATENT DOCUMENTS

EP     1703266     9/2006

(Continued)

*Primary Examiner* — Ida M Soward
(74) *Attorney, Agent, or Firm* — Fletcher Yoder

(57) ABSTRACT

A detector including an electrode formed from a first layer of conductive material, a readout line formed from a second layer of conductive material, and a via electrically connecting the readout line and the electrode. In one embodiment, the detector includes a source electrode and a drain electrode formed from the first layer of conductive material, and a data line formed from the second layer of conductive material, such that the source and drain electrodes are vertically offset from the data line. Alternatively, in another embodiment, the detector includes a gate electrode formed from the first layer of conductive material, and a scan line formed from the second layer of conductive material, such that the gate electrode is vertically offset from the scan line.

20 Claims, 2 Drawing Sheets

U.S. PATENT DOCUMENTS

| | | | |
|---|---|---|---|
| 6,617,561 B1 * | 9/2003 | Wei et al. | 250/208.1 |
| 6,623,161 B2 | 9/2003 | Aufrichtig et al. | |
| 6,714,191 B2 * | 3/2004 | Wu et al. | 345/204 |
| 6,764,900 B2 * | 7/2004 | Shih | 438/241 |
| 6,894,283 B1 * | 5/2005 | Busse et al. | 250/370.09 |
| 7,307,301 B2 * | 12/2007 | Possin et al. | 257/292 |
| 7,405,403 B2 | 7/2008 | Vilain | |
| 2002/0076844 A1 * | 6/2002 | Possin et al. | 438/30 |
| 2004/0207087 A1 * | 10/2004 | Kurashina | 257/758 |
| 2004/0262611 A1 * | 12/2004 | Lai | 257/72 |
| 2005/0082492 A1 * | 4/2005 | Lin et al. | 250/370.14 |
| 2005/0082968 A1 * | 4/2005 | Choi et al. | 313/506 |
| 2005/0134768 A1 * | 6/2005 | Sugiura et al. | 349/113 |
| 2005/0167573 A1 * | 8/2005 | Maruyama et al. | 250/214.1 |
| 2005/0179964 A1 * | 8/2005 | Izumi | 358/483 |
| 2005/0199969 A1 * | 9/2005 | Kobayashi et al. | 257/414 |
| 2005/0231656 A1 * | 10/2005 | den Boer et al. | 349/42 |
| 2005/0253077 A1 * | 11/2005 | Ikeda et al. | 250/370.09 |
| 2005/0259201 A1 * | 11/2005 | Hu et al. | 349/122 |
| 2005/0270590 A1 | 12/2005 | Izumi et al. | |

FOREIGN PATENT DOCUMENTS

| | | |
|---|---|---|
| JP | 2016777 | 1/1990 |
| WO | 9203977 | 3/1992 |
| WO | 9628438 | 9/1996 |

* cited by examiner

THIN FILM TRANSISTORS FOR IMAGING SYSTEM AND METHOD OF MAKING THE SAME

BACKGROUND

The invention relates generally to imaging systems. In particular, the invention relates to thin film transistors for use in detectors of such imaging systems and methods of making the same.

Non-invasive imaging broadly encompasses techniques for generating images of the internal structures or regions of a person or object that are otherwise inaccessible for visual inspection. For example, non-invasive imaging techniques are commonly used in the industrial field for inspecting the internal structures of parts and in the security field for inspecting the contents of packages, clothing, and so forth. One of the best known uses of non-invasive imaging, however, is in the medical arts where these techniques are used to generate images of organs and/or bones inside a patient which would otherwise not be visible.

One class of non-invasive imaging techniques that may be used in these various fields is based on the differential transmission of X-rays through a patient or object. In the medical context, a simple X-ray imaging technique may involve generating X-rays using an X-ray tube or other source and directing the X-rays through an imaging volume in which the part of the patient to be imaged is located. As the X-rays pass through the patient, the X-rays are attenuated based on the composition of the tissue they pass through. The attenuated X-rays then impact a detector that converts the X-rays into signals that can be processed to generate an image of the part of the patient through which the X-rays passed based on the attenuation of the X-rays. Typically the X-ray detection process utilizes a scintillator, which generates optical photons when impacted by X-rays, and an array of photosensor elements, which generate electrical signals based on the number of optical photons detected.

Some X-ray techniques utilize very low X-ray flux so that patient exposure can be extended. For example, fluoroscopic techniques are commonly used to monitor an ongoing procedure or condition, such as the insertion of a catheter or probe into the circulatory system of a patient. Such fluoroscopic techniques typically obtain large numbers of images that can be consecutively displayed to show motion in the imaged area in real-time or near real-time.

However fluoroscopic techniques, as well as other low X-ray flux imaging techniques, may suffer from poor image quality due to the relatively weak X-ray signal relative to the electronic noise attributable to the detector. As a result it is typically desirable to improve the efficiency of the detection process, such as by reducing the electronic noise attributable to the detector. For instance, various aspects of the thin film transistors (TFTs) employed to read out the detector elements may contribute to the overall electronic noise. For example, the source and drain of the TFT may be formed from the same layer of material as the data lines to which they connect. However, different electrical properties are typically desired in the data lines as compared to the source and drain and, therefore, configurations which improve data line performance may detriment source and drain performance and vice versa. For example, it may be desirable for the data lines to be relatively thick to reduce their resistance. However, thick source and drain lines will undercut during the wet etch performed during TFT formation, leading to a longer channel length. In general, the longer the channel, the greater the problems associated with electronic noise, which is a function of charge trapping which in turn is a function of the channel length. Additionally, the "on" resistance of the TFT is also a function of channel length resulting in slower pixel readout rates as channel length is increased. As a result, smaller channel lengths are generally desirable for improved TFT performance. Because of these contrary aspects, the data lines and/or the source and drain electrodes formed from the same layer of material (and, therefore, having the same thickness) may not have optimal performance.

Similarly, the scan line connected to the gate of the TFT may impact detector performance. In particular, the scan lines and gate are typically formed from same layer of material. However, as with the data lines, a thick scan line may be desirable to decrease the resistance of the scan line. The resulting thick gate electrode, however, may lead to leakage currents due to a larger step at the edge of the gate electrode. Therefore, improving the electrical properties of the readout lines (i.e., the scan lines and data lines) may inadvertently degrade detector performance in other ways due to the negative impacts on electrodes formed from the same respective layers of materials.

Therefore, there is a need for a thin film transistor that addresses some or all of the problems set forth above.

BRIEF DESCRIPTION

In accordance with one aspect of the present technique, a detector is provided. The detector includes an electrode formed from a first layer of conductive material, a readout line formed from a second layer of conductive material, and a via electrically connecting the readout line and the electrode.

In accordance with another aspect of the present technique, a detector for use in an imaging system is provided. The detector comprises a plurality of detector elements, each detector element having a thin film transistor. The thin film transistor includes a source electrode and a drain electrode formed from a first layer of conductive material, a data line formed from a second layer of conductive material, and a via electrically connecting the data line and the drain electrode.

In accordance with yet another aspect of the present technique, a detector for use in an imaging system is provided. The detector includes a plurality of detector elements, each detector element comprising a thin film transistor. The thin film transistor includes a gate electrode formed from a first layer of conductive material, a scan line formed from a second layer of conductive material, and a via electrically connecting the scan line and the gate electrode.

In accordance with still another aspect of the present technique, a detector for use in an imaging system is provided. The detector comprises a plurality of detector elements, each detector element comprising a thin film transistor. The thin film transistor comprises a gate electrode formed from a first layer of conductive material, a source electrode and a drain electrode formed from a second layer of conductive material, a scan line formed from a third layer of conductive material, a first via electrically connecting the scan line and the gate electrode, a data line formed from a fourth layer of conductive material, and a second via electrically connecting the data line and the drain electrode.

DRAWINGS

These and other features, aspects, and advantages of the present invention will become better understood when the following detailed description is read with reference to the accompanying drawings in which like characters represent like parts throughout the drawings, wherein.

Figure 3:
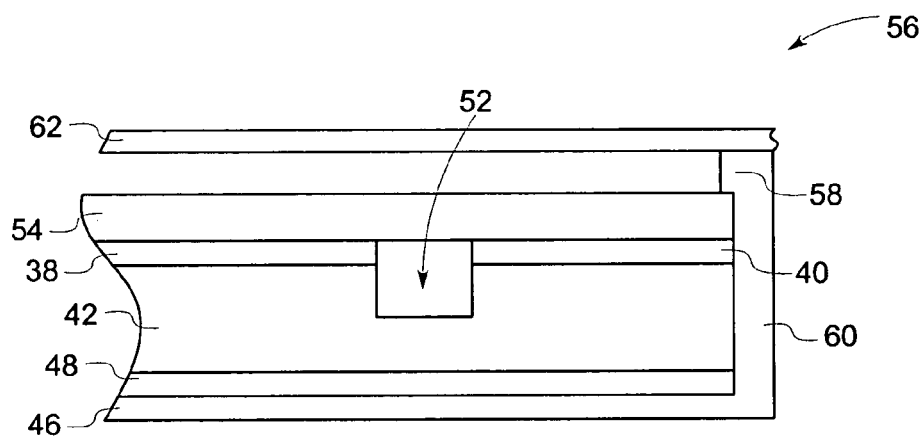
Figure 4:
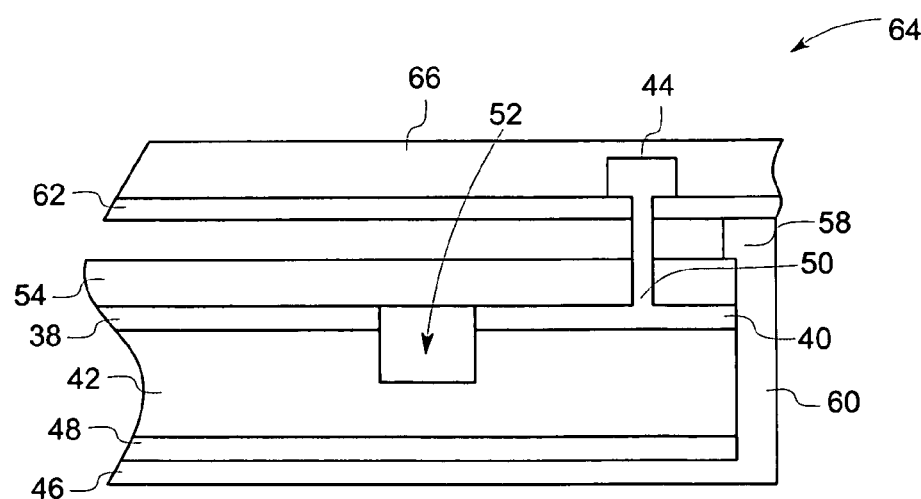

FIG. 3 is a cross-sectional view of a thin film transistor having scan lines at a different level than the gate electrodes, in accordance with one aspect of the present technique; and FIG. 4 is a cross-sectional view of a thin film transistor having data and scan lines at different levels than the respective source, drain, and gate electrodes, in accordance with one aspect of the present technique.

DETAILED DESCRIPTION

Figure 1:
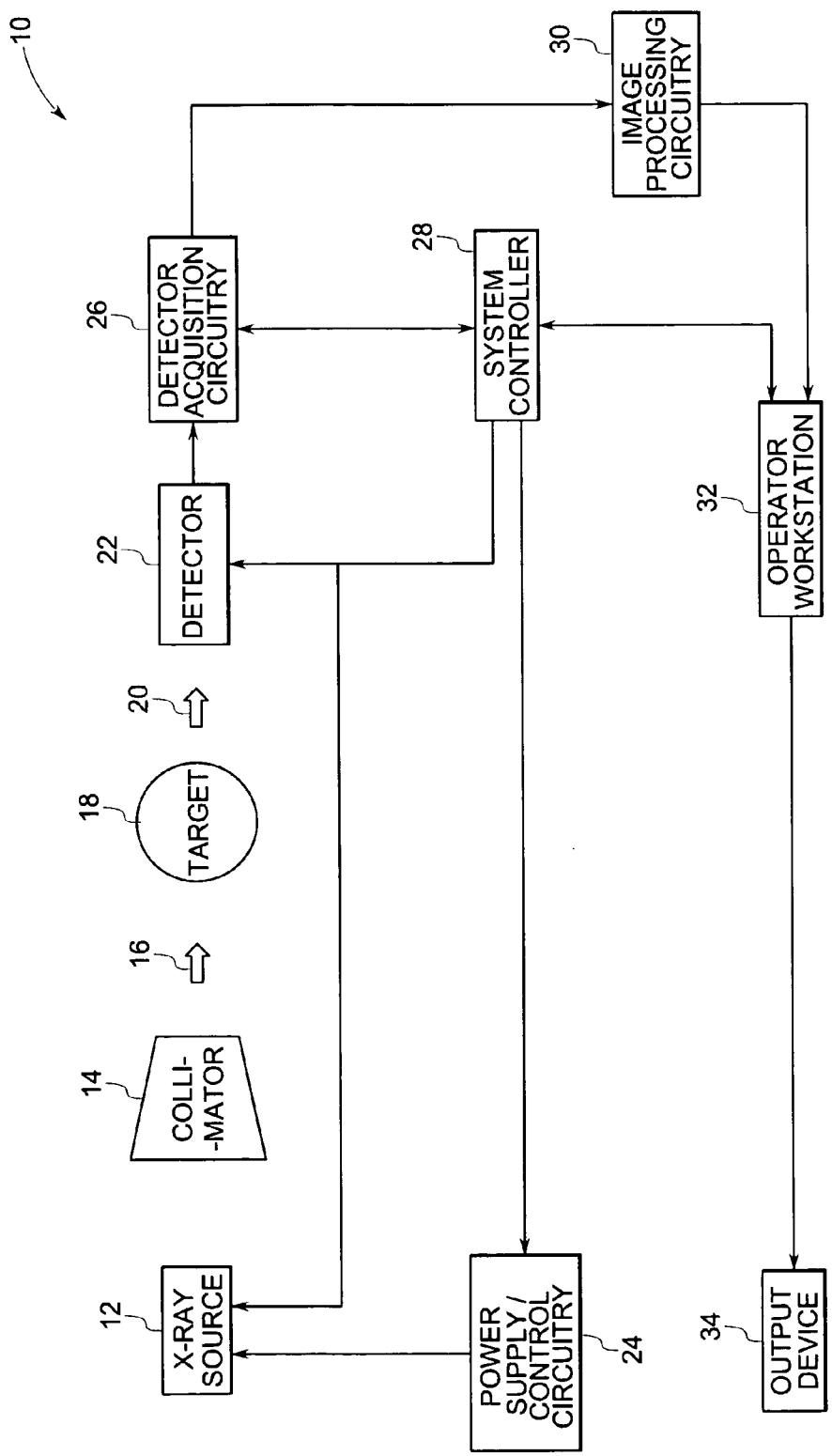
FIG. 1 is a diagrammatic representation of an exemplary X-ray imaging system, in accordance with one aspect of the present technique.

FIG. 1 is an illustration of an X-ray imaging system designated generally by a reference numeral 10. In the illustrated embodiment, the X-ray imaging system 10 is designed to acquire and process image data in accordance with the present technique, as will be described in greater detail below. The X-ray imaging system 10 includes an X-ray source 12 positioned adjacent to a collimator 14. In one embodiment, the X-ray source 12 is a low X-ray flux source and is employed in low X-ray flux imaging techniques, such as fluoroscopic techniques, or the like. As will be appreciated by those of ordinary skill in the art, X-ray flux is representative of the amount of X-rays emitted by the X-ray source per unit time. Collimator 14 permits a stream of X-ray radiation 16 to pass into a region in which a target 18, such as, a human patient, is positioned. A portion of the radiation is attenuated by the target 18. This attenuated radiation 20 impacts a detector 22, such as a fluoroscopic detector. As described in detail below, the detector 22 converts the X-ray photons incident on its surface to electrical signals that are acquired and processed to construct an image of the features within the target 18.

The X-ray source 12 is controlled by power supply/control circuitry 24 which furnishes both power and control signals for examination sequences. Moreover, detector 22 is coupled to detector acquisition circuitry 26, which commands acquisition of the signals generated in the detector 22. Detector acquisition circuitry 26 may also execute various signal processing and filtration functions, such as, for initial adjustment of dynamic ranges, interleaving of digital, and so forth.

In the depicted exemplary embodiment, one or both of the power supply/control circuitry 24 and detector acquisition circuitry 26 are responsive to signals from a system controller 28. In some exemplary systems it may be desirable to move one or both of the detector 22 or the X-ray source 12. In such systems, a motor subsystem may also be present as a component of the system controller 28 to accomplish this motion. In the present example, the system controller 28 also includes signal processing circuitry, typically based upon a general purpose or application specific digital computer. The system controller 28 may also include memory circuitry for storing programs and routines executed by the computer, as well as configuration parameters and image data, interface circuits, and so forth.

Image processing circuitry 30 is also present in the depicted embodiment of the X-ray imaging system 10. The image processing circuitry 30 receives acquired projection data from the detector acquisition circuitry 26 and processes the acquired data to generate one or more images based on X-ray attenuation.

One or more operator workstation 32 is also present in the depicted embodiment of the X-ray imaging system 10. The operator workstation 32 allows an operator to initiate and configure an X-ray imaging examination and to view the images generated as part of the examination. For example, the system controller 28 is generally linked to operator workstation 32 so that an operator, via one or more input devices associated with the operator workstation 32, may provide instructions or commands to the system controller 28.

Similarly, the image processing circuitry 30 is linked to the operator workstation 32 such that the operator workstation 32 may receive and display the output of the image processing circuitry 30 on an output device 34, such as a display or printer. The output device 34 may include standard or special purpose computer monitors and associated processing circuitry. In general, displays, printers, operator workstations, and similar devices supplied within the system may be local to the data acquisition components or may be remote from these components, such as elsewhere within an institution or hospital or in an entirely different location. Output devices and operator workstations that are remote from the data acquisition components may be linked to the image acquisition system via one or more configurable networks, such as the internet, virtual private networks, and so forth. As will be appreciated by one of ordinary skill in the art, though the system controller 28, image processing circuitry 30, and operator workstation 32 are shown distinct from one another in FIG. 1, these components may actually be embodied in a single processor-based system, such as a general purpose or application specific digital computer. Alternatively, some or all of these components may be present in distinct processor-based systems, such as a general purpose or application specific digital computers, configured to communicate with one another. For example, the image processing circuitry 30 may be a component of a distinct reconstruction and viewing workstation.

In accordance with certain embodiments of the present invention, the detector 22 of an imaging system, such as that depicted in FIG. 1, is constructed as a multi-layer structure to obtain the desired electrical properties for the structures associated with each level. In one example of an embodiment of the invention, the exemplary detector 22 includes an array of photosensor elements, such as photodiodes formed from amorphous silicon, disposed on a substrate. In such an embodiment, the photodiodes may be arranged in an array of rows and columns that define the pixels, or picture elements, read out by the detector acquisition circuitry 26. In this embodiment, each pixel includes a photodiode and a thin film transistor (TFT), which may be selectively activated using data lines and scan lines. Such an embodiment may also include a scintillator, which, when exposed to X-rays, generates the optical photons detected by the photodiode. In various embodiments of the present technique, vias are employed to electrically couple data lines and/or scan lines to respective electrodes of the TFT through various intervening layers. The data and/or scan lines connected in this manner are in turn connected to contact fingers, or other conductive readout structures, to allow data to be transferred from the sensor elements to the readout circuitry. As will be appreciated by those of ordinary skill in the art, the vias are electrically conductive structures that interconnect different conductive or metallized layers, which are otherwise separated by one or more insulating layers. In this manner, electrical signals may be conducted between different layers or conductors in a multi-layer structure.

For example, in one embodiment of the present invention, the data lines may be vertically offset from the source and drain electrodes present in the TFT employed in detector 22. For example, in certain embodiments, the data lines and the source and drain electrodes may be formed at separate processing steps, i.e. from different layers of conductive material, which are typically deposited at different times or stages of the formation process. As a result, the layer of conductive material from which the data line is formed may be of a different thickness or composition than the layer of conductive material from which the source and drain electrodes are formed. For example, the data lines may be formed from a thicker layer than that from which the source and drain electrodes are formed.

Figure 2:
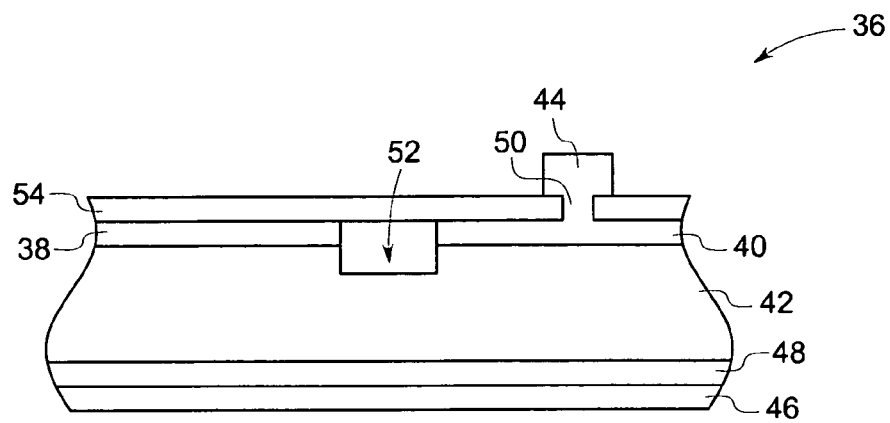
FIG. 2 is a cross-sectional view of a thin film transistor having data lines at a different level than the source and drain electrodes, in accordance with one aspect of the present technique.

A depiction of such an exemplary embodiment is provided in FIG. 2. In FIG. 2, a cross-sectional view of an exemplary TFT 36 having a source electrode 38 and a drain electrode 40 disposed above a semiconductor layer 42 is shown. In one embodiment, the semiconductor layer 42 comprises amorphous silicon. In the depicted embodiment, the data lines 44 and the source and drain electrodes 38 and 40 are formed at separate steps. In this embodiment, the source and drain electrodes 38 and 40 are formed by depositing a first layer of a conductive material, such as, molybdenum, chromium, aluminum, titanium, tungsten, or combinations thereof, on the semiconductor layer 42. In addition, a barrier metal layer (not depicted) may be present between the semiconductor layer 42 and the layer from which the source and drain electrodes 38 and 40 are formed, such as in embodiments where the semiconductor layer 42 is made entirely or in part of amorphous silicon and the source and drain electrodes 38 and 40 are made entirely or in part of aluminum, to prevent diffusion between the layers. Further, the TFT 36 of the depicted embodiment includes a gate electrode 46 disposed below the semiconductor layer 48. The gate electrode 46 is typically, electrically insulated with the semiconductor layer 42 by means of a dielectric layer 48.

The various layers of the TFT 36, as described herein, may be formed by any suitable deposition techniques, such as sputtering, chemical vapor deposition (CVD), plasma enhanced chemical vapor deposition (PECVD), radio frequency plasma enhanced chemical vapor deposition (RF-PECVD), expanding thermal-plasma chemical-vapor deposition (ETPCVD), reactive sputtering, electron-cyclodrawn-residence plasma-enhanced chemical-vapor deposition (ECRPECVD), inductively coupled plasma-enhanced chemical-vapor deposition (ICPECVD), sputter deposition, evaporation, atomic layer deposition (ALD), or combinations thereof. Furthermore, other types of deposition techniques suitable for use in manufacturing integrated circuits or semiconductor based devices may also be used in the deposition of some or all of the layers described herein.

In one embodiment, the source and drain electrodes 38 and 40 are formed from a layer of conductive material having a thickness in a range from about 0.02 microns to about 0.2 microns. The layer of conductive material is patterned to form source and drain electrodes 38 and 40. In certain embodiments, a landing pad (not shown) for a via 50 may be formed on the layer of conductive material from which the source or drain electrodes are formed, either before or after patterning the metal film to form source and drain electrodes 38 and 40. In these embodiments, the landing pad may or may not be positioned over the gate electrode 46. In some embodiments, the step of forming the source electrodes may also include electrically coupling the photosensor elements to the source electrode 38. In these embodiments, the source electrode 38 may either be coupled to the photosensor elements through a second via (not shown) or by extending the source electrode 38 under the photosensor elements.

The source and drain electrodes 38 and 40 are typically separated by a channel 52. The bottom surface of the active channel typically comprises exposed semiconductor material of the semiconductor layer 42. The channel 52 is typically formed by etching or otherwise eliminating the portion of the layer of conductive material disposed between the source electrode 38 and the drain electrode 40, revealing, and typically partially etching, the semiconductor layer 42. In one embodiment, the channel 52 has a length in a range from about 1.5 microns to about 3 microns. Forming the source and drain electrodes 38 and 40 from a relatively thin film of conductive material or metallized layer facilitates formation of a channel 52 having smaller length. As will be appreciated by those skilled in the art, a smaller channel length causes less charge retention in the channel 52, thereby reducing the noise level of TFT 36.

In the depicted exemplary embodiment, the TFT 36 also includes a dielectric layer 54 disposed over the source and drain electrodes 38 and 40. In this embodiment, the TFT 36 further includes data lines 44 formed from a second layer of conductive material disposed above the dielectric layer 54. In accordance with the present technique, the first layer of conductive material used to form the source and drain electrodes 38, 40 may differ in thickness and/or composition from the second layer of conductive material used to form the data lines 44. For example, in one embodiment it is desirable to have thick data lines 44, i.e., thicker than the source and drain electrodes 38, 40, in order to reduce the resistance values associated with the data lines and thereby reduce the noise factor contributed by the data lines. In an example of such an embodiment, the data lines 44 are formed from a layer of conductive material having a thickness in a range from about 0.2 microns to about 2 microns. In another embodiment, the data lines 44 comprise conductive elements such as, molybdenum, aluminum, copper, titanium, tungsten, or combinations thereof.

Additionally, the TFT 36 comprises a via 50 electrically connecting the data line 44 to the drain electrode 40. In one embodiment, the via 50 is formed by cutting or selectively etching the dielectric layer 54. In certain embodiments, a common electrode and/or a TFT light blocking element may also be formed from the layer from which the data line 44 is formed. In such embodiments, the common electrode is situated between the scintillator and the connections to the photosensitive regions while the light blocking element is used to prevent light generated within the scintillator from entering the TFT channel 52.

Referring now to FIG. 3, another exemplary embodiment of the TFT 36 is depicted which has a gate electrode 46 vertically offset from the scan lines 58. For example, in certain embodiments, the gate electrode 46 and the scan lines 58 may be formed at different processing steps, i.e., from different layers of conductive material, which are typically deposited at different times or stages during the formation process. Due to these separate deposition steps, the layers used to form the gate electrode 46 and the scan lines 58 may be of different thicknesses or compositions. In other words, the layer of conductive material from which the scan line is formed may be of a different thickness and/or composition than the layer from which the gate electrode is formed. For example, the scan lines 58 may be formed from a thicker layer than that from which the gate electrode is formed.

FIG. 3 illustrates a cross sectional view of a TFT 56 according to one aspect of the present technique. The TFT 56 includes gate electrode 46 disposed below a semiconductor layer 42. In one embodiment, the semiconductor layer 42 comprises amorphous silicon. In one embodiment, the gate electrode 46 of the TFT 56 is formed by deposition of a first layer of conductive material, such as molybdenum, chromium, aluminum, tungsten, titanium, or combinations thereof. Typically, it is desirable to have small optical transmission values, for the gate electrode in order to avoid scattered light from within the substrate entering the TFT 56. Accordingly, a minimum thickness of the gate electrode may be determined by a desirable optical transmission value. In one embodiment, the optical transmission values are less than 20%. In this embodiment, the thickness of the layer of conductive material forming the gate electrode is in a range from about 0.02 microns to about 0.15 microns. Additionally, minimizing the thickness of the gate electrode 46 results in a decrease in height of the structure of the TFT 56. As would be appreciated by those skilled in the art, the greater the height of the TFT 56, the greater the propensity for leakage currents between the gate electrode 46 and either the source or drain electrodes 38 or 40. Additionally, a landing pad (not shown) for a via connecting the gate electrode 46 and a scan line 58 may also be formed during or after the formation of the gate electrode 46.

In the depicted embodiment, the semiconductor layer 42 and the gate electrode 46 are electrically insulated by means of a first dielectric layer, such as a dielectric layer 48. In this embodiment, the TFT 56 also includes the source and drain electrodes 38 and 40 disposed above the semiconductor layer 42.

In one embodiment, a second dielectric layer, such as a dielectric layer 54 is disposed on the source and drain electrodes 38 and 40. Additionally, vias 60 may be formed at each TFT 56 of the detector 22 to expose a landing pad formed on the gate electrode 46. Typically, the vias 60 are employed to electrically couple the gate electrode 46 and the scan lines 58. Further, in the depicted embodiment, the scan line 58 is disposed above the dielectric layer 54. In one embodiment, the scan line 58 is formed by depositing and patterning a second layer of conductive material above the dielectric layer 54. In this embodiment, the scan line 58 is spatially offset from the channel 52, i.e., the scan line 58 is generally offset from the channel 52 and, therefore, does not overlie the channel 52. As mentioned above, it is desirable to have low resistance scan lines in order to improve the performance of the detector 22. For example, in order to have a flat panel detector operating at higher frames per second (60 fps), it is desirable to decrease the resistance of the scan lines by increasing its thickness. In one embodiment, the second layer of conductive material has a thickness in a range from about 0.15 microns to about 1 micron. In another embodiment, layer of conductive material from which the scan line 58 is formed includes such metals as, molybdenum, chromium, aluminum, tungsten, titanium, and the like, or combinations thereof. In addition, the layer of conductive material used to form the scan line may also be patterned to form other structures, such as vias and other inter structures. Further, in certain embodiments, a dielectric layer, such as a dielectric layer 62 may be disposed on the scan line 58.

FIG. 4 illustrates a cross sectional view of a TFT 64 incorporating data lines vertically offset from the source and drain electrodes 38 and 40 and scan lines vertically offset from the gate electrode 46, as discussed above. In the illustrated embodiment, the scan line 58 is disposed below the data line 44. In the depicted embodiment, a dielectric layer, such as a dielectric layer 62 is disposed on the scan lines 58. Further, in the illustrated embodiment, a dielectric layer, such as a dielectric layer 66 is disposed above the data line 44. Conversely, in other embodiments, the scan lines 58 may be disposed above the data lines 44. In these embodiments, the scan line 58 may be disposed on the dielectric layer disposed above the data line and may be formed after forming the TFT 64 and the data lines 44. The combined exemplary structure depicted in FIG. 4, may be formed in accordance with the structures discussed above in regard to FIGS. 2 and 3 and may therefore, incorporate the respective benefits discussed with regard to the preceding exemplary structures.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A detector, comprising:
   an electrode formed from a first layer of conductive material;
   a readout line formed from a second layer of conductive material; and
   a via electrically connecting the readout line and the electrode.

2. The detector of claim 1, wherein the first layer of conductive material and the second layer of conductive material differ in at least one of composition and thickness.

3. The detector of claim 1, wherein the first layer of conductive material comprises one of a molybdenum, chromium, aluminum, tungsten, titanium, or combinations thereof.

4. A detector for use in an imaging system comprising:
   a plurality of detector elements, each detector element comprising a thin film transistor comprising:
   a source electrode and a drain electrode formed from a first layer of conductive material;
   a data line formed from a second layer of conductive material; and
   a via electrically connecting the data line and the drain electrode.

5. The detector of claim 4, wherein the first layer of conductive material and the second layer of conductive material differ in at least one of composition or thickness.

6. The detector of claim 4, wherein the first layer of conductive material has a thickness in a range from about 0.02 microns to about 0.2 microns.

7. The detector of claim 4, wherein the second layer of conductive material has a thickness in a range from about 0.2 microns to about 2 microns.

8. The detector of claim 4, further comprising a channel disposed between the source and drain electrodes, wherein the channel has a length in a range from about 1.5 microns to about 3 microns.

9. A detector for use in an imaging system comprising:
   a plurality of detector elements, each detector element comprising a thin film transistor comprising:
   a gate electrode formed from a first layer of conductive material;
   a scan line formed from a second layer of conductive material; and
   a via electrically connecting the scan line and the gate electrode.

10. The detector of claim 9, wherein the first layer of conductive material and the second layer of conductive material differ in at least one of composition or thickness.

11. The detector of claim 9, wherein the first layer of conductive material has a thickness in a range from about 0.02 microns to about 0.15 microns.

12. The detector of claim 9, wherein the second layer of conductive material has a thickness in a range from about 0.15 microns to about 1 micron.

13. A detector for use in an imaging system comprising:
a plurality of detector elements, each detector element comprising a thin film transistor comprising:
- a gate electrode formed from a first layer of conductive material;
- a source electrode and a drain electrode formed from a second layer of conductive material;
- a scan line formed from a third layer of conductive material;
- a first via electrically connecting the scan line and the gate electrode;
- a data line formed from a fourth layer of conductive material; and
- a second via electrically connecting the data line and the drain electrode.

14. The detector of claim 13, wherein one of the first layer of conductive material or the second layer of conductive material comprises one of a molybdenum, chromium, aluminum, tungsten, titanium, or combinations thereof.

15. The detector of claim 13, further comprising a channel disposed between the source and drain electrodes.

16. The detector of claim 13, wherein the channel has a length in a range from about 1.5 microns to about 3 microns.

17. The detector of claim 13, wherein the first layer of conductive material has a thickness in a range from about 0.02 microns to about 0.15 microns.

18. The detector of claim 13, wherein the second layer of conductive material has a thickness in a range from about 0.02 microns to about 0.2 microns.

19. The detector of claim 13, wherein the third layer of conductive material has a thickness in a range from about 0.15 microns to about 1 micron.

20. The detector of claim 13, wherein the fourth layer has a thickness in a range from about 0.2 microns to about 2 microns.

* * * * *